United States Patent
Ershov et al.

(10) Patent No.: US 10,185,234 B2
(45) Date of Patent: Jan. 22, 2019

(54) HARSH ENVIRONMENT OPTICAL ELEMENT PROTECTION

(71) Applicant: Cymer Inc., San Diego, CA (US)

(72) Inventors: Alexander I. Ershov, Escondido, CA (US); Norbert R. Bowering, Bielefeld (DE); Bruno M. La Fontaine, San Diego, CA (US); Silvia De Dea, San Diego, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 1055 days.

(21) Appl. No.: 13/645,253

(22) Filed: Oct. 4, 2012

(65) Prior Publication Data

US 2014/0098413 A1  Apr. 10, 2014

(51) Int. Cl.
*G02B 5/08* (2006.01)
*G03F 7/20* (2006.01)

(52) U.S. Cl.
CPC ....... *G03F 7/70958* (2013.01); *G02B 5/0891* (2013.01); *G03F 7/70983* (2013.01)

(58) Field of Classification Search
CPC ......... G02B 5/283; G02B 5/285–5/288; G03F 7/2008; G03F 7/70–7/70991; G21K 1/062
USPC .............. 359/258–361, 884; 355/67, 71
See application file for complete search history.

(56) References Cited

U.S. PATENT DOCUMENTS

| | | | |
|---|---|---|---|
| 6,724,462 B1 * | 4/2004 | Singh | B82Y 10/00 355/30 |
| 6,897,456 B2 * | 5/2005 | Hasegawa | G03F 7/70841 250/365 |
| 8,081,317 B2 * | 12/2011 | Kalkowski | G03F 1/46 356/511 |
| 2002/0150836 A1 | 10/2002 | Miwa et al. | |
| 2003/0164562 A1 | 9/2003 | Li et al. | |
| 2005/0199830 A1 | 9/2005 | Bowering et al. | |
| 2005/0276988 A1 | 12/2005 | Trenkler | |
| 2006/0245058 A1 * | 11/2006 | Van Herpen | B82Y 10/00 359/587 |
| 2009/0251772 A1 * | 10/2009 | Trenkler | B82Y 10/00 359/359 |

(Continued)

FOREIGN PATENT DOCUMENTS

| | | |
|---|---|---|
| CN | 1355739 A | 8/2002 |
| CN | 1868033 A | 11/2006 |

(Continued)

OTHER PUBLICATIONS

Chinese Office Action of related Chinese Patent Application No. 201380051709.8 dated May 31, 2016.

*Primary Examiner* — William R Alexander
*Assistant Examiner* — Jeffrey Madonna
(74) *Attorney, Agent, or Firm* — Arent Fox LLP

(57) ABSTRACT

Optical element protection systems for protecting optical elements and particularly reflective optical elements from degradation of their optical properties in harsh environments such as the environment inside a vacuum chamber of an EUV light source. The systems include the uses of combinations of materials in various layers where the materials are chosen and the layers are configured and arranged to extend the lifetime of the optical element without compromising its optical properties.

7 Claims, 6 Drawing Sheets

(56) References Cited

U.S. PATENT DOCUMENTS

| | | | |
|---|---|---|---|
| 2010/0066991 A1* | 3/2010 | Schwarzl | B82Y 10/00 355/71 |
| 2010/0226004 A1* | 9/2010 | Nishimoto | G02B 5/208 359/359 |
| 2011/0075253 A1 | 3/2011 | Bowering et al. | |
| 2011/0134410 A1* | 6/2011 | Van Herpen | B82Y 10/00 355/71 |
| 2012/0170015 A1 | 7/2012 | Yakunin et al. | |
| 2015/0055111 A1* | 2/2015 | Trenkler | B82Y 10/00 355/67 |
| 2016/0012929 A1* | 1/2016 | Kuznetsov | G21K 1/062 250/505.1 |

FOREIGN PATENT DOCUMENTS

| | | |
|---|---|---|
| CN | 102652286 A | 8/2012 |
| CN | 102792228 A | 11/2012 |
| JP | 2005-268750 A | 9/2005 |
| JP | 2006-173446 A | 6/2006 |

\* cited by examiner

HARSH ENVIRONMENT OPTICAL ELEMENT PROTECTION

FIELD

The present disclosure relates to optical elements designed to operate in harsh environments. To accomplish this end, the optical elements are provided with one or more protective layers to shield the optical element from damage that otherwise would be caused by unprotected exposure to a harsh environment. Such an arrangement is advantageously deployed where the harsh environment is in a vacuum chamber of an apparatus for generating extreme ultraviolet ("EUV") radiation from a plasma created through discharge or laser ablation of a source material. In this application, the optical elements are used, for example, to collect and direct the radiation for utilization outside of the vacuum chamber, e.g., for semiconductor photolithography.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates such as silicon wafers.

Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

One LPP technique involves generating a stream of target material droplets and irradiating at least some of the droplets with laser light pulses. In more theoretical terms, LPP light sources generate EUV radiation by depositing laser energy into a target material having at least one EUV emitting element, such as xenon (Xe), tin (Sn), or lithium (Li), creating a highly ionized plasma with electron temperatures of several 10's of eV.

The energetic radiation generated during de-excitation and recombination of these ions is emitted from the plasma in all directions. In one common arrangement, a near-normal-incidence mirror (often termed a "collector mirror" or simply a "collector") is positioned to collect, direct (and in some arrangements, focus) the light to an intermediate location. The collected light may then be relayed from the intermediate location to a set of scanner optics and ultimately to a wafer.

In the EUV portion of the spectrum it is generally regarded as necessary to use reflective optics for the collector. At the wavelengths involved, the collector is advantageously implemented as a multi-layer mirror ("MLM"). As its name implies, this MLM is generally made up of alternating layers of material over a foundation or substrate.

The optical element must be placed within the vacuum chamber with the plasma to collect and redirect the EUV light. The environment within the chamber is inimical to the optical element and so limits its useful lifetime, for example, by degrading its reflectivity. It is a high temperature environment. An optical element within the environment may be exposed to high energy ions or particles of source material. These particles of source material can cause not only physical damage but can also cause localized heating of the MLM surface. The source materials may be particularly reactive with a material making up at least one layer of the MLM, e.g., molybdenum and silicon, so that steps may need to be taken to reduce the potential effects of the reactivity, especially at elevated temperatures, or keep the materials separated. Temperature stability, ion-implantation and diffusion problems may need to be addressed even with less reactive source materials, e.g., tin, indium, or xenon.

Thus, a collector is an example of the use of an optical element that must be able to withstand harsh conditions over an extended period of time without exhibiting appreciable degradation of its optical properties. There are techniques which may be employed to increase optical element lifetime despite these harsh conditions. For example, protective layers or intermediate diffusion barrier layers may be used to isolate the MLM layers from the environment. The collector may be heated to an elevated temperature of, e.g., over 500° C., to evaporate debris from its surface. An etchant may be employed e.g., a halogen etchant, to etch debris from the collector surfaces and create a shielding plasma in the vicinity of the reflector surfaces.

Despite these techniques, there remains a need to extend collector lifetime. With this in mind, applicants disclose arrangements for protecting a optical element operating in a harsh environment designed to extend the useful lifetime of the optical element.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect, the invention comprises an optical element for reflecting extreme ultraviolet radiation, the optical element including a stack of alternating layers of at least two dielectric materials a protective layer arranged on an outermost layer of said stack, where the protective layer comprises zirconium nitride, ZrN. The protective layer may also, i.e., alternatively, comprise yttrium oxide, $Y_2O_3$. The protective layer may also comprise aluminum oxide, $Al_2O_3$ with or without a layer of Si with a naturally occurring coating of $SiO_2$. The protective layer may also comprise $MoSi_2$ with or without a layer of silicon dioxide, $SiO_2$. The protective layer may also comprise a layer of SiN and a layer of Mo.

The protective layer may also comprise a layer Mo and a second layer of Si with the Si layer having an outer coating of $SiO_2$.

The optical element may also comprise a substrate, a stack located on the substrate of repeated units of alternating layers of at least two dielectric materials with a at least a subset of the repeated units including an internal protective layer comprising $Si_3N_4$. The internal protective layer may also comprise $MoSi_2$. The subset may include repeated units closer to an external surface of said stack than to the substrate. The optical element may also include an outer protective layer comprising ZrN. The protective layer may also comprise $Y_2O_3$.

In another aspect, the invention comprises apparatus having a source adapted to produce a target of a material in a liquid state, a laser adapted to irradiate said target to change a state of the material from said liquid state to a plasma state to produce EUV light in an irradiation region, and an optical system adapted to convey said EUV light from said irradiation region to a workpiece, in which the optical system comprises an optical element for reflecting extreme ultraviolet radiation, the optical element comprising alternating layers of at least two dielectric materials and a protective layer arranged on an outermost layer of said optical element alternating materials, wherein the protective coating comprises ZrN. The protective layer may also comprise $Y_2O_3$.

In yet another aspect, the invention comprises a product made using an apparatus which includes a source adapted to produce a target of a material in a liquid state, a laser adapted to irradiate said target to change a state of the material from said liquid state to a plasma state to produce EUV light in an irradiation region, and an an optical system adapted to convey said EUV light from said irradiation region to a workpiece, in which the optical system comprises an optical element for reflecting extreme ultraviolet radiation, the optical element comprising alternating layers of at least two dielectric materials and a protective layer arranged on an outermost layer of said optical element alternating materials, wherein the protective coating comprises ZrN. The protective layer may also comprise $Y_2O_3$.

DETAILED DESCRIPTION

Figure 1:
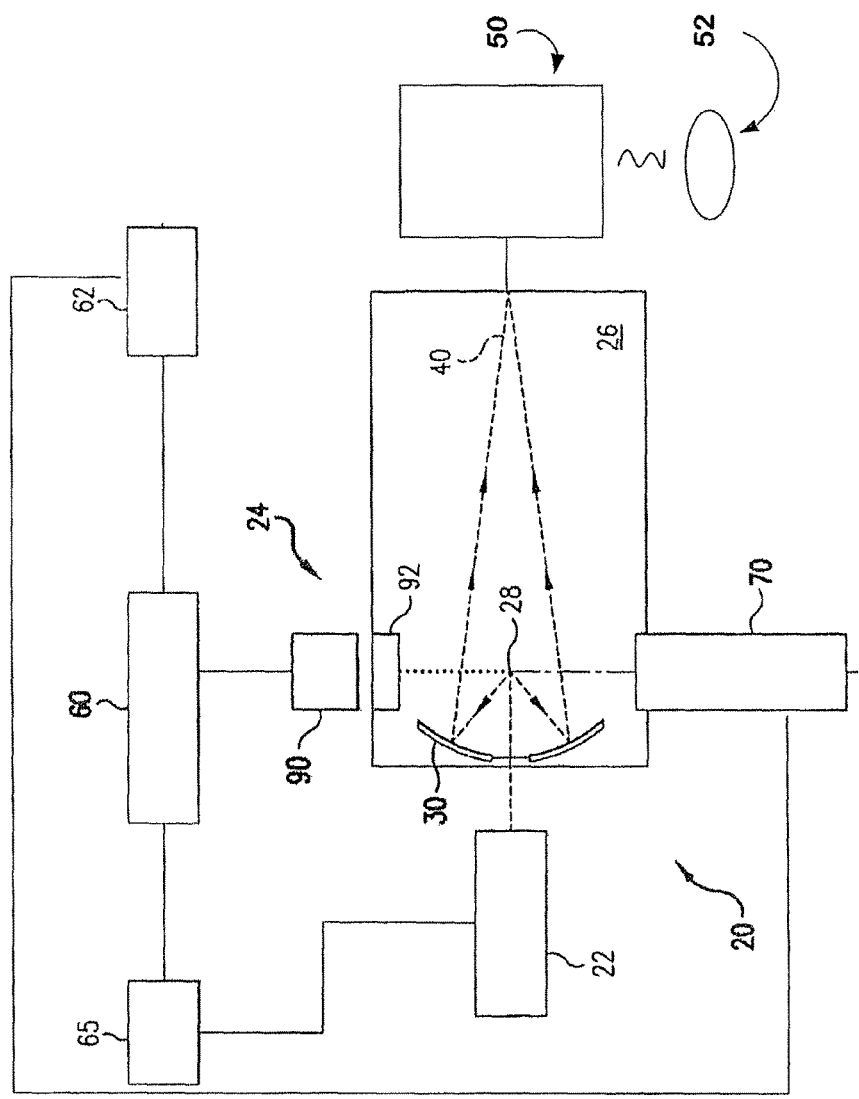
FIG. 1 shows a schematic, not to scale, view of an overall broad conception for a laser-produced plasma EUV light source system according to an aspect of the present invention.

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments.

With initial reference to FIG. 1 there is shown a schematic view of an exemplary EUV light source, e.g., a laser produced plasma EUV light source 20 according to one aspect of an embodiment of the present invention. As shown, the EUV light source 20 may include a pulsed or continuous laser source 22, which may for example be a pulsed gas discharge $CO_2$ laser source producing radiation at 10.6 μm. The pulsed gas discharge $CO_2$ laser source may have DC or RF excitation operating at high power and high pulse repetition rate.

The EUV light source 20 also includes a target delivery system 24 for delivering target material in the form of liquid droplets or a continuous liquid stream. The target material may be made up of tin or a tin compound, although other materials could be used. The target delivery system 24 introduces the target material into the interior of a chamber 26 to an irradiation region 28 where the target material may be irradiated to produce a plasma. In some cases, an electrical charge is placed on the target material to permit the target material to be steered toward or away from the irradiation region 28. It should be noted that as used herein an irradiation region is a region where target material irradiation may occur, and is an irradiation region even at times when no irradiation is actually occurring.

Continuing with FIG. 1, the light source 20 may also include one or more optical elements such as a collector 30. The collector 30 may be a normal incidence reflector, for example, implemented as an MLM, that is, a SiC substrate coated with a Mo/Si multilayer with additional thin barrier layers deposited at each interface to effectively block thermally-induced interlayer diffusion. The collector 30 may be in the form of a prolate ellipsoid, with an aperture to allow the laser light to pass through and reach the irradiation region 28. The collector 30 may be, e.g., in the shape of a ellipsoid that has a first focus at the irradiation region 28 and a second focus at a so-called intermediate point 40 (also called the intermediate focus 40) where the EUV light may be output from the EUV light source 20 and input to, e.g., an integrated circuit lithography tool 50 which uses the light, for example, to process a silicon wafer workpiece 52 in a known manner. The silicon wafer workpiece 52 is then additionally processed in a known manner to obtain an integrated circuit device.

As described above, one of the technical challenges in the design of an optical element such as the collector 30 is extending its lifetime. An approach that has been tried to extend collector lifetime is the use of a protective layer made of SiN. This has not been demonstrated to extend collector lifetime sufficiently to prove useful.

One limitation on collector lifetime is degradation of the coating of the multilayer mirror caused by bubble formation and delamination under hydrogen attack. One purpose of the protective layer is thus to dissipate the heat that is locally transferred from incident source material (e.g., tin) particles such that the stack does not overheat locally and form blisters. The protective layer has to be thick enough to reduce the heat load received on its surface by the source material particle impact to a sufficiently low value when the heat wave has penetrated to the top layers of the multilayer coating underneath. Therefore, the thickness of the protective layer should preferably be in the range of about 10 nm to about 100 nm, and more preferably be in the range of about 10 nm to about 50 nm, with the lower end of this range being determined by the goal that it be thick enough to reduce the heat load received on its surface and the higher end being determined by the goal of remaining very transparent to 13.5 nm radiation.

The protective layer materials and structure are chosen such that they are compatible with excited ionic, atomic, and molecular hydrogen and source material, for example, tin. They should dissipate the heat very well without degradation, transmit 13.5 nm EUV light very well and not oxidize unacceptably in the configurations presented. With the protective layer the strong local heating after source material particle impact is dissipated sufficiently within the protective layer so that the stack underneath is at least partially protected from the high-temperature heat wave and therefore does not form blisters.

With these goals in mind, ZrN may be used as the material for the protective layer. For this embodiment, the arrangement may have the following structures:

Vacuum
ZrN (protective layer)
Si/Mo (stack)
Substrate

Figure 2:
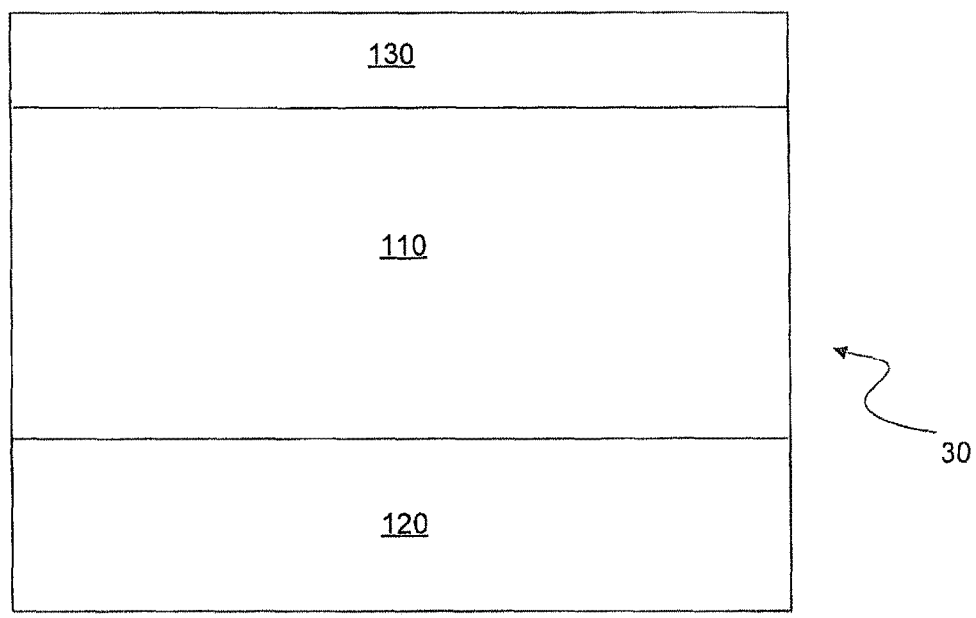
FIG. 2 is a not-to-scale diagrammatic cross section through an MLM making up a possible embodiment of the collector 30 of FIG. 1.

This arrangement is shown in FIG. 2, which is a not-to-scale diagrammatic cross section through an MLM making up the collector 30. The collector 30 is exposed to a vacuum 100 in the chamber 26. While referred to as a vacuum here, one of ordinary skill in the art will understand that the vacuum 100 here is a harsh environment, that is, that it may contain reactive materials, ions, radicals, and particles of source material all at elevated temperatures.

The main body of the collector 30 is an EUV-reflective multilayer coating made up of a repeating stack 110 of alternating layers of dielectric material, preferably Si and Mo, made and configured in a known manner, arranged on a substrate 120. For example, the stack 110 made by made up of a Si/Mo stack of sixty layers, or a Si/Mo stack with thin diffusion barrier layers of, e.g. $Si_3N_4$, between Mo and Si layers, for protection against heat transfer and hydrogen diffusion. For this and for all embodiments, there may also be a smoothing layer or interface layer (not shown) between the substrate 120 and the stack 110.

Interposed between the vacuum 100 and the stack 110 is a protective layer 130 exposed to the vacuum 100 and between the vacuum 100 and the stack 110. As described, the protective layer 130 must be thick enough to stop hydrogen ions and radicals from diffusing into the MLM structure. At the same time, the protective layer 130 must be thin enough that it is sufficiently transparent to EUV radiation. Typically an overall thickness of the protective layer 130 in the range of about 10 nm to about 50 nm satisfies both of these criteria.

A preferred material for the protective layer 130 in the embodiment of FIG. 2 is ZrN. ZrN has been found to be much more stable than SiN in the source environment. It is preferable that a protective layer 100 made of ZrN have a thickness in the range of about 10 nm to about 30 nm, more preferably in the range of about 10 nm to about 20 nm. These dimensions are illustrative only and are not limitations on the scope of the invention.

Another preferred material for the protective layer 130 in the embodiment of FIG. 2 is $Y_2O_3$. Yttria oxide also has properties that permit it to be stable in the source environment. For this embodiment, the arrangement may have the following structures:

Vacuum
$Y_2O_3$ (protective layer)
Si/Mo (stack)
Substrate

It is preferable that a protective layer 100 made of $Y_2O_3$ have a thickness in the range of about 10 nm to about 30 nm, more preferably in the range of about 10 nm to about 20 nm. These dimensions are illustrative only and are not limitations on the scope of the invention $Al_2O_3$ may also be used as the material for the protective layer 130. For this embodiment, the arrangement may have the following structures:

Vacuum
$Al_2O_3$ (protective layer)
Si/Mo (stack)
Substrate

It is preferable that a protective layer 130 made of $Al_2O_3$ have a thickness in the range of about 10 nm to about 30 nm, more preferably in the range of about 10 nm to about 20 nm. These dimensions are illustrative only and are not limitations on the scope of the invention.

Such a protective layer may additionally include a Si sublayer with a $SiO_2$ coating developing naturally through oxidation. This would result in the following structure:

Vacuum
$SiO_2$ (coating)
Si (sublayer)
$Al_2O_3$ (sublayer)
Si/Mo (stack)
Substrate The Si sublayer preferably has a thickness in the range of about 10 nm to about 20 nm. The Si sublayer will develop a natural oxide coating having a thickness in the range of about 1 nm to about 2 nm. These dimensions are illustrative only and are not limitations on the scope of the invention.

As further regards materials, Mo has a known resistance to hydrogen embrittlement. This property makes Mo a suitable protective layer material except that Mo in the source environment is unstable because it is susceptible to oxidation, i.e., it will form molybdenum oxide. This creates the problem that molybdenum oxide has much higher EUV absorption than Mo so that the molybdenum oxide will absorb an unacceptable quantity of the generated radiation it is supposed to reflect. This limits the usefulness of Mo as a material for the protective layer. However, the use of a composite protective layer made up of a sublayer of Mo and a sublayer of another material can exploit the resistance of Mo to hydrogen embrittlement while minimizing the negative effects of Mo oxidation.

Accordingly, in this embodiment, a SiN protective layer is overcoated with an additional thin layer of Mo. The results in the following structure:

Vacuum
Mo (sublayer)
SiN (sublayer))
Si/Mo (stack)
Substrate

Figure 3:
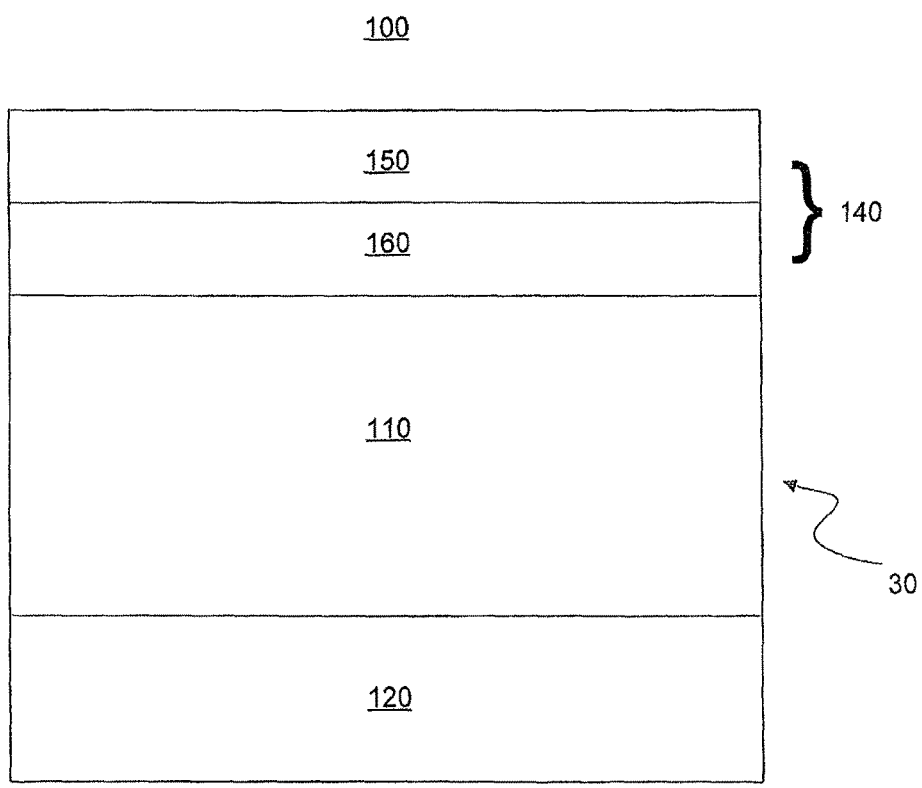
FIG. 3 is a not-to-scale diagrammatic cross section through an MLM making up another possible embodiment of the collector 30 of FIG. 1.

This arrangement is shown in FIG. 3, which is a not-to-scale diagrammatic cross section through an MLM making up the collector 30. Interposed between the vacuum 100 and the stack 110 is a composite protective layer 140 made up of an Mo sublayer 150 exposed to the vacuum 100 and a SiN sublayer 160 between the Mo sublayer 150 and the stack 110. In this arrangement the Mo sublayer 120 will protect SiN sublayer 130 from degradation, while SiN sublayer 130 protects stack 110 from hydrogen attack and blister formation.

As described, typically the overall thickness of the protective layer 130 is in the range of about 10 nm to about 50 nm to stop hydrogen ions and radicals from diffusing into the MLM structure while remaining transparent to EUV radiation. It is preferable that the Mo sublayer 150 have a thickness that is small enough that reflectivity loss through oxidation of the Mo is acceptable. In a preferred embodiment, the Mo sublayer 150 has a thickness in the range of about 3 nm to about 10 nm, and even more preferably about 3 nm. The SiN sublayer 160 preferably has a thickness in the range of about 10 nm to about 20 nm. These dimensions are illustrative only and are not limitations on the scope of the invention.

According to another aspect of the present invention, an MLM is provided with a composite protective layer that includes a thin layer of Si over a layer of Mo. The thin Si layer develops a natural oxide that protects the Mo layer from oxidation. According to this embodiment of the invention, the resulting arrangement may thus have the following structure:

Vacuum
$SiO_2$ (coating)
Si (sublayer)
Mo (sublayer)
Si/Mo (stack)
Substrate

Figure 4:
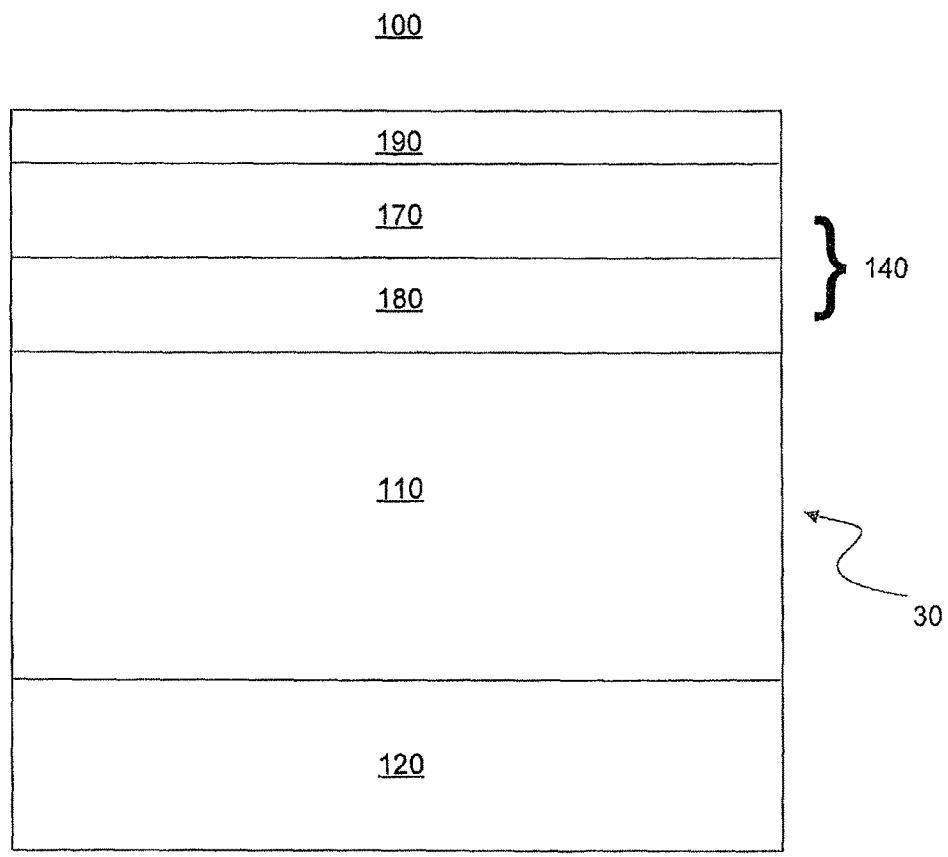
FIG. 4 is a not-to-scale diagrammatic cross section through an MLM making up another possible embodiment of the collector 30 of FIG. 1.

This arrangement is shown in FIG. 4, which is a not-to-scale diagrammatic cross section through an MLM making up the collector 30. As in FIG. 3, the main body of the collector 30 is a repeating stack 110 of alternating layers of dielectric material, preferably Si and Mo, made and configured in a known manner, arranged on a substrate 120. Interposed between the vacuum 100 and the stack 110 is a composite protective layer 140. In the arrangement of FIG. 4, the composite protective layer 140 is made up of an Si sublayer 170 exposed to the vacuum 100 and an Mo sublayer 180 between the Si sublayer 170 and the stack 110. The Si sublayer 170 develops a $SiO_2$ coating 190 that protects the Mo layer from oxidation.

As described, typically the overall thickness of the protective layer 130 is in the range of about 10 nm to about 50 nm to stop hydrogen ions and radicals from diffusing into the MLM structure while remaining transparent to EUV radiation. It is preferable that the Si sublayer 170 have a thickness of about 2 nm to about 4 nm. The Mo sublayer 180 preferably has a thickness in the range of about 10 nm to about 20 nm. The $SiO_2$ coating 190 will have a thickness in the range of about 1 nm to about 2 nm. These dimensions are illustrative only and are not limitations on the scope of the invention.

The protective layer 130 may also be made up of a compound that includes Mo. One candidate for a material for protective layer 130 is molybdenum disilicide, $MoSi_2$. $MoSi_2$ is a hard and oxidation resistant material with a high melting point (~2030° C.) which has outstanding stability at high temperatures (since Mo and Si are in equilibrium, according to the phase diagram). It is also a good barrier to chemical attack and likely also to hydrogen diffusion. It has a high thermal conductivity. Its transparency for 13.5 nm EUV radiation is very high. For example, high temperature multilayer coatings based on $MoSi_2$/Si stacks have shown excellent high temperature and long-term stability properties.

$MoSi_2$ layers can be deposited in a highly dispersed way with almost amorphous layer growth. This is a significant advantage compared to the micro-crystalline growth of thick Mo layers.

According to this embodiment of the invention, the resulting arrangement may thus have the following structure:

$MoSi_2$ (protective layer)
Si/Mo (stack)
Substrate

The $MoSi_2$ protective layer preferably has a thickness in the range of about 20 nm to about 30 nm. These dimensions are illustrative only and are not limitations on the scope of the invention.

The $MoSi_2$ protective layer could also be provided with a $SiO_2$ protective coating. According to this embodiment of the invention, the resulting arrangement may thus have the following structure:

$SiO_2$ (coating)
$MoSi_2$ (protective layer)
Si/Mo (stack)
Substrate

The $SiO_2$ protective coating preferably has a thickness in the range of about 1 nm to about 3 nm. The $MoSi_2$ protective layer preferably has a thickness in the range of about 20 nm to about 30 nm. These dimensions are illustrative only and are not limitations on the scope of the invention.

Similar coatings could be done with $Mo_2C$, NbC or $NbSi_2$ in place of $MoSi_2$. Another candidate is $Mo_2C$ (molybdenum carbide). Other candidates would be the corresponding niobium compounds, $NbSi_2$ and NbC. Other carbides or borides like SiC, ZrC, Zr $B_2$, $B_4C$ which are highly transparent at 13.5 nm could also be considered as a material.

Figure 5:
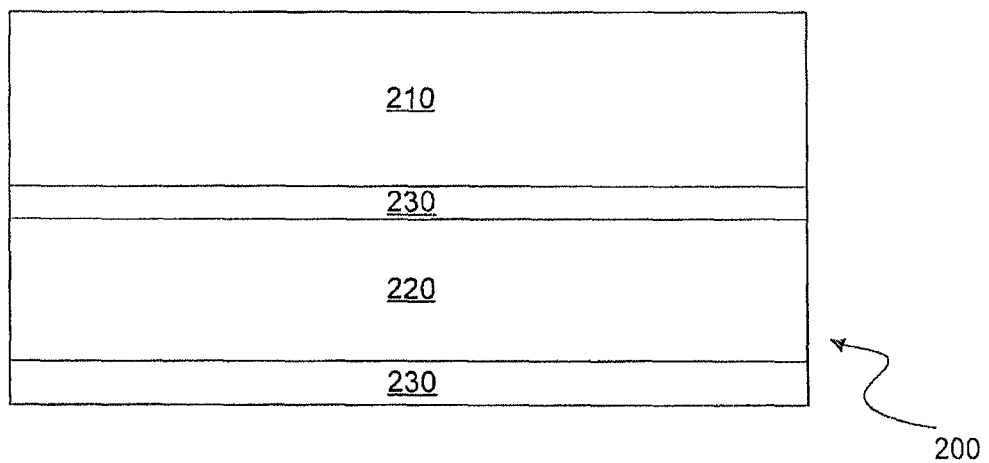
FIG. 5 is a not-to-scale diagrammatic cross section through a repeating unit of a stack portion for a MLM making up another possible embodiment of the collector 30 of FIG. 1.

The stack 110 may also include internal protective layers as part of some or all of the repeating units (Si/Mo or Si/b/MO/b) making up the stack 110. These internal protective layers may be used instead of the protective layer on the exterior of the stack. Thus, the stack 110, instead of having alternating units of Si and Mo for a Si/Mo repeating unit, or equivalently a Mo/Si arrangement, would have an arrangement of Mo/p/Si/p for a repeating unit, with "p" representing an internal protective layer. This is shown in FIG. 5, which shows a repeating unit 200 made up of a layer of 210 of Mo or Si, a layer 220 made up of the other of Mo or Si, and intervening internal protective layer 230. The internal protective layer 230 could be part of each repeating unit 200 or in several outermost repeating units 200 of the stack 110. The internal protective layer 230 could also prevent hydrogen diffusion and reduces penetration by tin ions and dissipates heat. Since the internal protective 230 is at least in the outer repeating units of the stack 110 it can be sacrificed like the other sublayers.

Suitable materials for the internal protective layer 230 would be $Si_3N_4$ having a thickness of about 0.8 nm and $MoSi_2$ having a thickness of about 1 nm. $Si_3N_4$ and $MoSi_2$ layers are presently preferred because of their high stability. Protective layer materials could also be SiC, $SiB_6$, $B_4C$, $NbSi_2$, $Mo_2C$, and BN. These layers are all fairly transparent to EUV radiation at 13.5 nm and serve as barriers for hydrogen diffusion, ion penetration and heat propagation. In most cases the layer growth is amorphous or nearly amorphous.

The protective layer thickness is preferably in the range of about 0.4 nm to about 1.2 nm since the preferred thickness of entire repeating unit 200 is about 7 nm for a highly reflective multilayer coating for 13.5 nm. The internal protective layer 230 preferably occurs at least once and more preferably twice in each repeating unit 200, especially in the outer repeating units 200.

These types of multilayer coatings are compatible with coating layer erosion. The collector lifetime is extended by the fact that the essential properties of the stack do not change when the sacrificial layers are lost due to erosion, even if this erosion does not occur uniformly.

Figure 6:
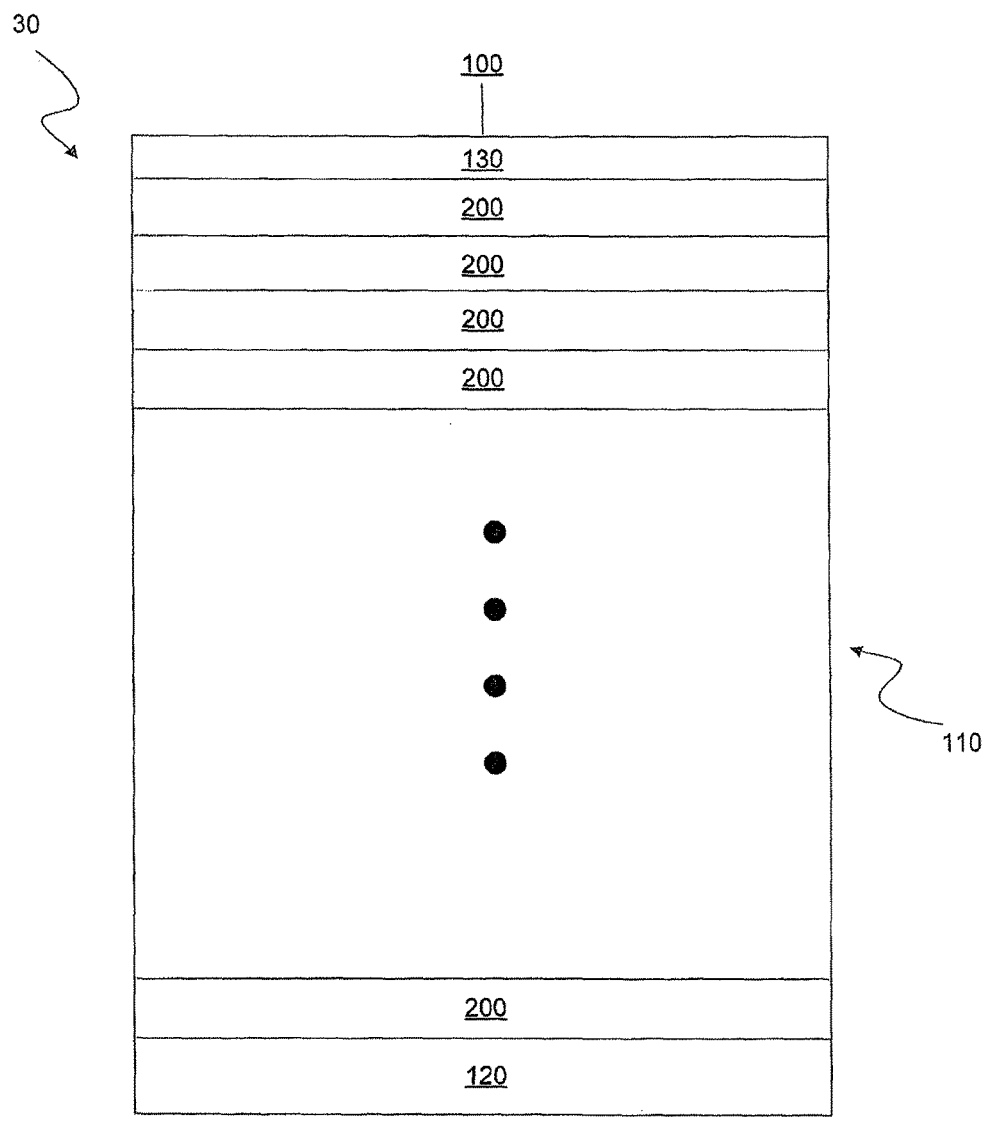
FIG. 6 is a not-to-scale diagrammatic cross section through an MLM including the repeating units of FIG. 5.

If this approach is used, instead of depositing sixty 60 repeating units 200 as the stack, which is sufficient in case of a coating which is not subject to erosion, it is preferable to use stack with the number of repeating units 200 being in the range of about eighty to about two thousand. This is depicted in FIG. 6, which shows the stack 110 made up of repeating units 200, with the solid dots indicating repetition of no fixed number of repeating units.

One example would be a stack with about five hundred periods, with each of the periods (or at least the outermost periods) having the structure:

Mo (layer)

Si₃N₄ (protective layer)

Si (layer)

Si₃N₄ (protective layer)

In this arrangement, the outmost Mo layer preferably has a thickness of 3 nm, the Si layer preferably has a thickness of 3.5 nm, and the Si₃N₄ protective layers have a thickness of about 0.8 nm. These dimensions are illustrative only and are not limitations on the scope of the invention.

Another example would be a stack with about five hundred periods, with each of the periods (or at least the outermost periods) having the structure:

Mo (layer)

MoSi₂ (protective layer)

Si (layer)

MoSi₂ (protective layer)

In this arrangement, the outmost Mo layer preferably has a thickness of 3 nm, the Si layer preferably has a thickness of 3.5 nm, and the MoSi₂ protective layers have a thickness of about 1 nm. These dimensions are illustrative only and are not limitations on the scope of the invention.

It will be apparent to one of ordinary skill in the art that the various protective layers described above can be applied using any one of a number of known processes such as magnetron sputtering. It will also be apparent to one of ordinary skill in the art that one or more adhesion layers may included in the disclosed arrangements in a known manner, for example between the substrate and the stack or between the protective layer and the stack. These adhesion layers may be made out of any one of number of known materials such as amorphous silicon.

The above description includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. An optical element for reflecting extreme ultraviolet radiation produced by laser irradiation of a target material comprising tin or a tin compound, said optical element comprising:

a substrate;

a stack disposed on said substrate, said stack comprising alternating first and second layers, said first layer comprising a first dielectric material and said second layer comprising a second dielectric material; and a protective layer arranged on said stack, wherein said protective layer comprises a first layer primarily of Al₂O₃ arranged on the stack, a second layer primarily of Si arranged on the first layer, and a coating of SiO2 arranged on the second layer.

2. An optical element as claimed in claim 1 wherein said first layer primarily of Al₂O₃ has a thickness of about 10 nm to about 30 nm.

3. An optical element as claimed in claim 2 wherein said first layer primarily of Al₂O₃ has a thickness of about 10 nm to about 00 nm.

4. An optical element as claimed in claim 1 wherein said second layer primarily of Si has a thickness of about 10 nm to about 20 nm.

5. An optical element as claimed in claim 1 wherein said coating has a thickness of about 1 nm to about 2 nm.

6. An optical element for reflecting extreme ultraviolet radiation, said optical element comprising:

a substrate;

a stack disposed on said substrate; said stack comprising alternating first and second layers, said first layer comprising a first dielectric material and said second layer comprising a second dielectric material;

a first protective layer arranged on and distinct from said stack, said first protective layer comprising primarily Mo;

a second protective layer on said first protective layer, said second protective layer comprising primarily Si; and an outer coating of SiO2 on said second protective layer.

7. Apparatus for producing extreme ultraviolet radiation comprising:

a chamber adapted to accommodate a vacuum;

a dispenser arranged to dispense a target material comprising tin into the chamber; and an optical element arranged in the chamber, said optical element comprising a substrate, a stack disposed on said substrate; said stack comprising alternating first and second layers, said first layer comprising a first dielectric material and said second layer comprising a second dielectric material, and a protective layer comprising a first layer primarily of Al₂O₃ arranged on the stack, a second layer primarily of Si arranged on the first layer, and a coating of SiO2 arranged on the second layer and arranged to be exposed to an interior of said chamber.

* * * * *